United States Patent
Ou et al.

(10) Patent No.: US 8,411,460 B2
(45) Date of Patent: Apr. 2, 2013

(54) PRINTED CIRCUIT BOARD

(75) Inventors: Guang-Feng Ou, Shenzhen (CN); Yong-Zhao Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 212 days.

(21) Appl. No.: 12/888,615

(22) Filed: Sep. 23, 2010

(65) Prior Publication Data
US 2012/0048601 A1  Mar. 1, 2012

(30) Foreign Application Priority Data
Aug. 26, 2010  (CN) .......................... 2010 1 0263935

(51) Int. Cl.
*H05K 1/11* (2006.01)
*H05K 1/14* (2006.01)

(52) U.S. Cl. ........ 361/794; 361/792; 361/795; 174/262; 174/263

(58) Field of Classification Search .......... 174/259–264; 361/792–795
See application file for complete search history.

(56) References Cited

U.S. PATENT DOCUMENTS

| | | | |
|---|---|---|---|
| 6,388,890 B1 * | 5/2002 | Kwong et al. | 361/780 |
| 6,613,413 B1 * | 9/2003 | Japp et al. | 428/131 |
| 6,757,178 B2 * | 6/2004 | Okabe et al. | 361/793 |
| 2005/0191785 A1 * | 9/2005 | Howard | 438/106 |
| 2005/0225955 A1 * | 10/2005 | Grebenkemper et al. | 361/780 |
| 2010/0000777 A1 * | 1/2010 | Zhao et al. | 174/262 |

* cited by examiner

*Primary Examiner* — Tuan T Dinh
(74) *Attorney, Agent, or Firm* — Altis Law Group, Inc.

(57) ABSTRACT

A printed circuit board includes a power layer, a ground layer, a signal layer, and a backboard. The backboard is arranged below the signal layer opposite to the ground layer. A number of vias are formed from the backboard through the signal layer, and then connected to the ground layer.

1 Claim, 2 Drawing Sheets

PRINTED CIRCUIT BOARD

BACKGROUND

1. Technical Field

The present disclosure relates to a printed circuit board.

2. Description of Related Art

Electromagnetic interference (EMI) can interfere with the functioning of components of electronic devices. This interference or interruption can occur among components of the same electronic device or may even permeate to other nearby electronic devices. Thus reduction of EMI in electronic devices or components is always a concern for electronic designers or manufacturers. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by limitation. It should be noted that references to "an" or "one" embodiment in this disclosure are not necessarily to the same embodiment, and such references mean at least one.

Figure 1:
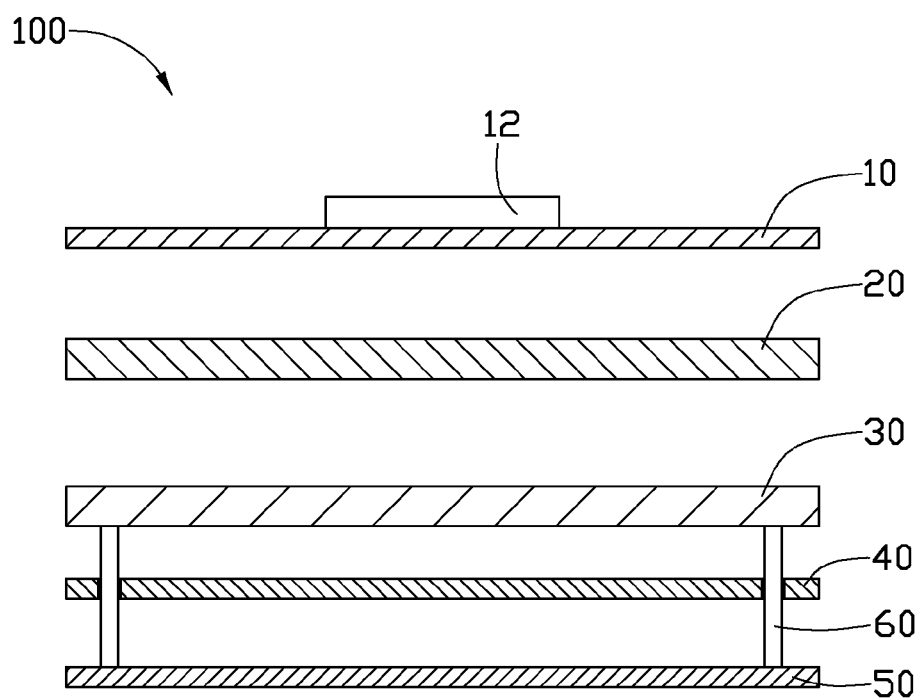
FIG. 1 is a schematic diagram of an exemplary embodiment of a printed circuit board.
Figure 2:
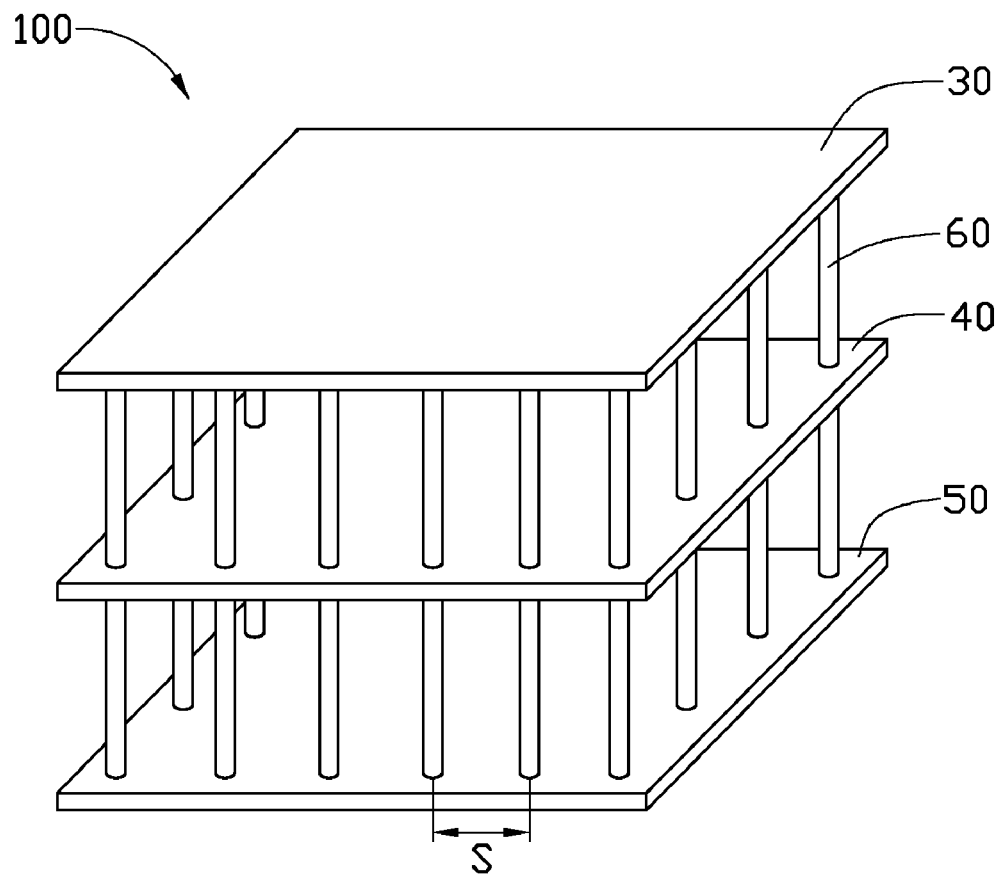
FIG. 2 is an isometric diagram of a portion of the printed circuit board of FIG. 1.

Referring to FIGS. 1 and 2, an embodiment of a printed circuit board (PCB) 100 includes four layers as an example. The PCB 100 includes two signal layers 10 and 40, a power layer 20, a ground layer 30, and a backboard 50. Dielectric is filled between the ground layer 30 and the signal layer 40. Dielectric is filled between the signal layer 40 and the backboard 50. A plurality of vias 60 is equidistantly arranged along sides of the backboard 50. The vias 60 extend through the signal layer 40, and then are connected to the ground layer 30. An electronic element, such as a central processing unit (CPU) 12 is set on the signal layer 10, opposite to the power layer 20.

In one embodiment, the backboard 50 is made of high-strength metal, such as steel or iron. Large thickness and small dielectric constant Er of dielectric between the signal layer 40 and the backboard 50 can be selected, to make characteristic resistance of the signal lines of the signal layer 40 consistent with characteristic resistance of the signal lines of the signal layer 10. The backboard 50 may only partially overlap the signal layer 40, which centralizes high speed signal lines and clock lines of the signal layer 40 of the PCB 100, to save cost. The number of the vias 60 can be increased or through holes can be defined in the backboard 50, to cool the signal layer 40 of the PCB 100.

In an alternative embodiment, to gain better shielding effectiveness, the via distance S between two adjacent vias 60 is less than a twentieth of the wave length of the radiated wave having the highest frequency transmitted by the PCB 100.

The wave length L of the radiated wave having the highest frequency can be calculated by the formula: $L=V/f$, where "V" stands for the transmission speed of signals flowing through the signal lines, and "f" stands for the highest frequency of the radiated wave. The speed V of the radiated wave having the highest frequency can be calculated by the formula: $V=C/Er^{1/2}$, where "C" stands for the speed of light, "Er" stands for the dielectric constant of the dielectric. According to the formula that wave length equals speed divided by frequency, the via distance S can be described as: $S<C/(20*f*Er^{1/2})$.

For example, when the frequency f=50 gigahertz of the radiated wave having the highest frequency, and the Er=4.0, according to the above formulas the via distance S<1.5 millimeters of the backboard 50 calculated.

The vias 60 are equidistantly arranged along sides of the backboard 50, and extend through the signal layer 40 and then are connected to the ground layer 30, thereby making the backboard 50, the signal layer 40, and the ground layer 30 form a Faraday cage. As is well known, a Faraday cage can effectively block interference from external electrical fields.

The backboard 50 reinforces strength of the PCB 100. Thus, thickness of each layer of the PCB 100 can be greatly reduced, which reduces electromagnetic interference (EMI) related to signals passing through the signal layers 10 and 40.

The backboard 50 increases strength of the PCB 100, and the vias 60 are equidistantly arranged along sides of the backboard 50 to form a Faraday cage. Therefore, EMI of the PCB 100 can be effectively minimized.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board (PCB) comprising:
a ground layer;
a first signal layer; and
a backboard;
wherein the backboard is arranged below the first signal layer, a plurality of vias is formed on the backboard and equidistantly arranged along peripheral edges of the backboard, the plurality of vias extend through the first signal layer and are connected to the ground layer for anti-EMI, and
further comprising a second signal layer and a power layer, wherein the power layer is sandwiched between the second signal layer and the ground layer, the first signal layer is arranged below the ground layer opposite to the power layer, the backboard is arranged below the first signal layer opposite to the ground layer;
wherein a distance S of each two vias of the plurality of vias is described as: $S<C/(20*f*Er^{1/2})$, where "C" stands for the speed of light, "Er" stands for the dielectric constant of dielectric formed between signal layer and power/ground layer, "f" stands for the highest frequency of radiated wave.

* * * * *